United States Patent
Lee et al.

(10) Patent No.: US 8,815,688 B2
(45) Date of Patent: Aug. 26, 2014

(54) METHOD OF MANUFACTURING POWER DEVICE

(75) Inventors: Jae Hoon Lee, Suwon-si (KR); Ki Se Kim, Suwon-si (KR); Jung Hee Lee, Daegu (KR); Ki Sik Im, Daegu (KR); Dong Seok Kim, Daegu (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 13/550,920

(22) Filed: Jul. 17, 2012

(65) Prior Publication Data

US 2013/0034939 A1     Feb. 7, 2013

(30) Foreign Application Priority Data

Aug. 1, 2011     (KR) .................. 10-2011-0076559

(51) Int. Cl.
*H01L 29/778* (2006.01)

(52) U.S. Cl.
USPC ........... 438/271; 438/268; 438/270; 257/192; 257/194; 257/201; 257/E29.246; 257/E29.262

(58) Field of Classification Search
None
See application file for complete search history.

(56) References Cited

U.S. PATENT DOCUMENTS

| | | | |
|---|---|---|---|
| 2007/0018243 A1* | 1/2007 | Ono et al. | 257/330 |
| 2008/0079009 A1* | 4/2008 | Yaegashi | 257/77 |
| 2009/0134456 A1* | 5/2009 | Sugimoto et al. | 257/329 |
| 2009/0315037 A1* | 12/2009 | Kikkawa | 257/76 |
| 2010/0044718 A1* | 2/2010 | Hanser et al. | 257/76 |
| 2010/0117119 A1* | 5/2010 | Uesugi et al. | 257/194 |
| 2011/0204381 A1* | 8/2011 | Okada et al. | 257/76 |

FOREIGN PATENT DOCUMENTS

| | | |
|---|---|---|
| JP | 2002-076339 | 3/2002 |
| KR | 10-2009-0060280 A | 6/2009 |

* cited by examiner

*Primary Examiner* — Julio J Maldonado
*Assistant Examiner* — Molly Reida
(74) *Attorney, Agent, or Firm* — McDermott Will & Emery LLP

(57) ABSTRACT

A method of manufacturing a power device includes forming a first drift region on a substrate. A trench is formed by patterning the first drift region. A second drift region is formed by growing n-gallium nitride (GaN) in the trench, and alternately disposing the first drift region and the second drift region. A source electrode contact layer is formed on the second drift region. A source electrode and a gate electrode are formed on the source electrode contact layer. A drain electrode is formed on one side of the substrate which is an opposite side of the first drift region.

11 Claims, 3 Drawing Sheets

METHOD OF MANUFACTURING POWER DEVICE

CROSS-REFERENCE TO RELATED APPLICATION

This application claims the benefit of Korean Patent Application No. 10-2011-0076559, filed on Aug. 1, 2011, in the Korean Intellectual Property Office, the disclosure of which is incorporated herein by reference.

BACKGROUND

1. Field of the Invention

The present invention relates to a power device manufacturing method, and more particularly, to a power device manufacturing method that manufactures a vertically-structured power device that is capable of operating a normally-OFF operation.

2. Description of the Related Art

A semiconductor light emitting device (LED) is a semiconductor device that generates various colored lights based on the re-bonding of an electron and a hole at a P-N junction when a current is applied. Demand for the semiconductor LED has been continuously increased since the semiconductor LED has many advantages, for example, a long lifespan, a low power consumption, a fast start-up, a high vibration resistance, and the like, when compared to a filament-based LED. Particularly, a nitride semiconductor that emits a blue light, in a short wavelength range, has drawn attention.

As information communication technologies have been considerably developed globally, communication technologies for high-speed and large-capacity signal communication have also been rapidly developed. Particularly, as demand for a personal cellular phone, a satellite communication, a military radar, a broadcasting communication, a communication relay, and the like in wireless communication technology has increased, the demands for a high-speed, a high-power electronic device required for a high-speed information communication system of a microwave band and a millimeter-wave band have increased. Also, research on a power device used for a high-power have been actively conducted to reduce energy loss.

Particularly, since the nitride semiconductor has advantageous properties, such as a high energy gap, a high heat stability, a high chemical stability, a high electronic saturation velocity of about $3 \times 10^7$ centimeters per second (cm/sec), the nitride semiconductor may be readily utilized as an optical element, and a high frequency and high power electronic device. Accordingly, research on the nitride semiconductor is being actively conducted the world over. An electronic device based on the nitride semiconductor may have varied advantages, such as, a high breakdown field of about $3 \times 10^6$ volts per centimeter (V/cm), a maximum current density, a stable high temperature operation, a high heat conductivity, and the like.

A heterostructure field effect transistor (HFET) generated based on a heterojunction of compound semiconductors has a high band-discontinuity at a junction interface, a high-electron density may be freed in the interface and thus, an electron mobility may increase. However, in an aluminum gallium nitride (AlGaN)/gallium nitride (GaN) HFET structure having a high electron mobility, a current flows even in a state where a signal is not applied and thus, power is consumed.

Since a power device may require a high current density, power loss in a normally-ON device may be a great drawback. Accordingly, a normally-OFF device that embodies a metal-oxide semiconductor (MOS) HFET by removing an AlGaN layer from a gate portion has been developed.

However, it is difficult to control the AlGaN layer to have a thickness less than or equal to 30 nanometers (nm). Also, the power device may operate vertically and thus, to increase a current density, increasing an area of the AlGaN layer may be needed. Recently, a vertically structured field-effect transistor (FET) device using a SiC substrate has been developed. However, the vertically structured FET device needs an implantation device to implant a carrier, and a process, for example, a heat treatment and the like, to activate a carrier.

SUMMARY

An aspect of the present invention provides a power device manufacturing method that manufactures a vertically structured power device that is capable of performing a normally-OFF operation.

According to an aspect of the present invention, there is provided a power device manufacturing method, the method including forming a first drift region on a substrate, forming a trench by patterning the first drift region, forming a second drift region by growing n-gallium nitride (GaN) in the trench, and alternately disposing the first drift region and the second drift region, forming a source electrode contact layer on the second drift region, forming a source electrode and a gate electrode on the source electrode contact layer, and forming a drain electrode on one side of the substrate which is an opposite side of the first drift region.

The forming of the second drift region may be performed in a temperature range from about 1000° C. to about 1200° C.

The power device manufacturing method may further include forming an n-GaN layer on the second drift region, and a doping concentration of an n-type dopant doped on the n-GaN layer may be higher than the second drift region.

The doping concentration of the n-type dopant doped on the n-GaN layer may be in a range from about $1.0 \times 10^{17}/\text{cm}^3$ to about $1.0 \times 10^{20}/\text{cm}^3$.

The first drift region may include at least one of p-GaN and aluminum gallium nitride (AlGaN).

The source electrode contact layer may include at least one of an $n^+$-GaN layer and a heterojunction of AlGaN and GaN.

The substrate may be selected from $n^+$-GaN, $n^+$-silicon carbide (SiC), sapphire, and silicon (Si).

The source electrode may include a material selected from a group consisting of chromium (Cr), aluminum (Al), tantalum (Ta), molybdenum (Mo), tungsten (W), titanium (Ti), and gold (Au).

Additional aspects, features, and/or advantages of the invention will be set forth in part in the description which follows and, in part, will be apparent from the description, or may be learned by practice of the invention.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Figure 1:
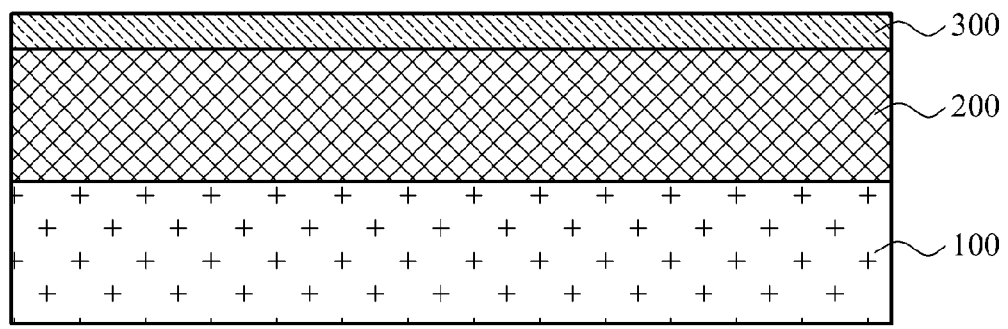
FIGS. 1 through 5 are sectional views describing a power device manufacturing method according to an embodiment of the present invention.

Reference will now be made in detail to embodiments of the present invention, examples of which are illustrated in the accompanying drawings, wherein like reference numerals refer to the like elements throughout. Embodiments are described below to explain the present invention by referring to the figures.

Throughout the specifications, when it is described that each of a layer, a side, a chip, and the like is formed "on" or "under" a layer, a side, a chip, and the like, the term "on" may include "directly on" and "indirectly on," and the term "under" may include "directly under" and "indirectly under." A standard for "on" or "under" of each element may be determined based on a corresponding drawing.

A size of each element in drawings may be exaggerated for ease of description, and does not indicate a real size.

FIGS. 1 through 5 describe a power device manufacturing method according to an embodiment of the present invention.

Referring to FIGS. 1 through 5, the power device manufacturing method according to an embodiment of the present invention may include forming a first drift region 200 on a substrate 100, forming a trench by patterning the first drift region 200, forming a second drift region 400 by growing n-gallium nitride (GaN) in the trench and alternately disposing the first drift region 200 and the second drift region 400, forming a source electrode contact layer 700 on the second drift region 200, forming a gate electrode 910 and source electrodes 920 on the source electrode contact layer 700, and forming a drain electrode 930 on one side of the substrate 100, that is, on an opposite side of the first drift region 200.

As shown in FIG. 1, the first drift region 200 may be formed on the substrate 100. The substrate 100 may be an n⁺-substrate, for example, n⁺-GaN and n⁺-silicon nitride (SiC), but the examples may not be limited thereto. Also, the substrate 100 may be an insulating substrate, for example, a glass substrate or a sapphire substrate, or may be a silicon (Si) substrate.

The first drift region 200 may be formed by growing p-GaN or aluminum gallium nitride (AlGaN) on the substrate 100. The p-GaN or the AlGaN may be grown based on various schemes, for example, a metal-organic chemical vapor deposition (MOCVD) scheme, a molecular beam epitaxy (MBE) scheme, a hydride vapor phase epitaxy (HVPE) scheme, and the like, so that the first drift region 200 may be formed, however, the examples may not be limited thereto. The first drift region 200 may operate as a p-type conductive column in a super-junction structure.

Figure 2:
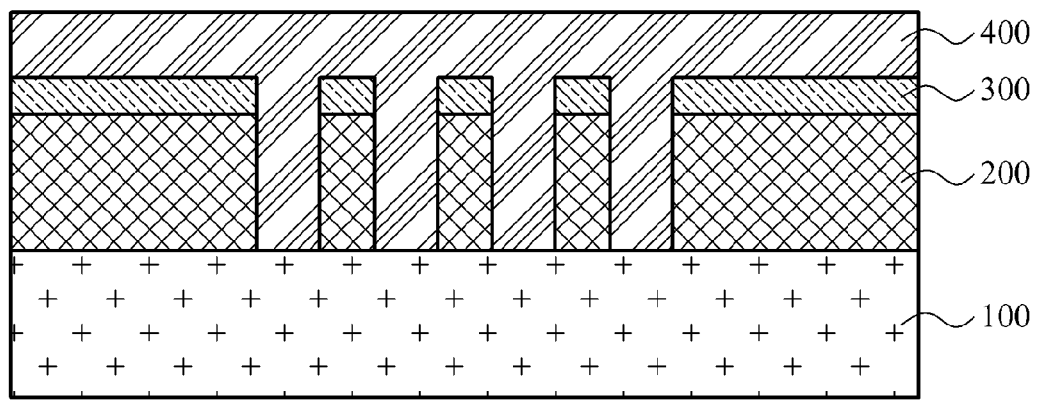

Subsequently, as shown in FIG. 2, a passivation layer 300 that performs as an insulating layer, on the first drift region 200. The passivation layer 300 may include a material selected from silicon oxide ($SiO_x$), silicon nitride ($SiN_x$), aluminum oxide ($Al_2O_3$), and SiC. The passivation layer 300 may be used in a process that patterns the first drift region 200 based on a photolithography process.

When a portion of the passivation layer 300 is removed, the first drift region 200 may be exposed, and the exposed first drift region 200 may be patterned so as to form a trench. In this example, a plurality of trenches may be formed, and a portion where the second drift region 400 is to be formed may be defined.

The plurality of trenches may be formed in the patterned first drift region 200. That is, the first drift region 200 and the plurality of trenches may be alternately disposed.

The second drift region 400 may be formed by growing n-GaN in the plurality of trenches. The second drift region 400 may be formed by growing n-GaN from the exposed substrate 100 at a lower portion of the plurality of trenches, based on the MOCVD scheme. While n-GaN is grown, a doping concentration of an n-type dopant may be adjusted in the second drift region 400. Since n-GaN is grown in the plurality of trenches, the second drift region 400 and the first drift region 200 may be alternately disposed. Thus, a super-junction structure may be formed.

A power device manufactured according to an embodiment of the present invention may have a relatively high withstand voltage since a depletion layer is formed near a p-n junction surface due to the super-junction structure during a p-n junction. During the p-n junction, a potential difference is locally created as a free electron and a hole are diffused to each other, and the power device is in a state of equilibrium, and thus, the depletion layer that does not contain a carrier may be formed near the p-n junction surface and the withstand voltage may increase.

The forming of the second drift region 400 by growing n-GaN may be performed in a temperature range from about 1000° C. to about 1200° C. Here, n-GaN may be regrown at a high temperature and thus, a crystal may not be damaged and a reliability may be secured. Also, an ion-implantation device and the like may not be additionally used and thus, a process may be simplified and a cost may be reduced.

Figure 3:
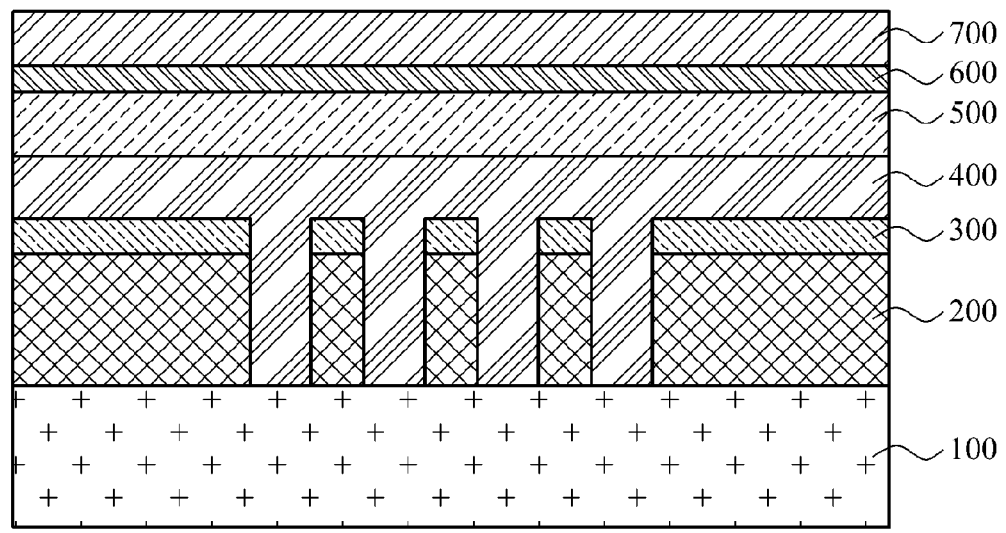

As shown in FIG. 3, after the second drift region 400 is formed, an n-GaN layer 500 that has a higher doping concentration of an n-type dopant than the second drift region 400 may be formed. A doping concentration of the n-GaN layer 500 may be in a range from about $1.0 \times 10^{17}/cm^3$ to $1.0 \times 10^{20}/cm^3$. Since the n-GaN layer 500 has a higher doping concentration of the n-type dopant than the second drift region 400, the n-GaN layer 500 may reduce a resistance, and a two-dimensional electron gas (2-DEG) may not be formed on a portion corresponding to a lower portion of the gate electrode 930 and thus, the power device may be capable of performing a normally-OFF operation.

The source electrode contact layer 700 that may reduce an ohmic resistance occurring when the source electrode contact layer is in a contact with the source electrode 920, may be formed on the n-GaN layer 500 having a higher doping concentration of the n-type dopant than the second drift region 400. The source electrode contact layer 700 may include at least one of n⁺-GaN and a heterojunction of AlGaN and GaN. That is, an ON-resistance may be reduced by forming the source electrode contact layer 700 from n⁺-GaN having a high doping concentration of an n-type dopant and thus, a current density may increase.

A p-GaN layer 600 may be additionally formed between the source electrode contact layer 700 and the n-GaN layer 500 having a higher doping concentration of the n-type dopant than the second drift region 400. The p-GaN layer 600 may reduce a resistance occurring when the p-GaN layer 600 is in contact with the source electrode contact layer 700, and may increase a current density.

Figure 4:
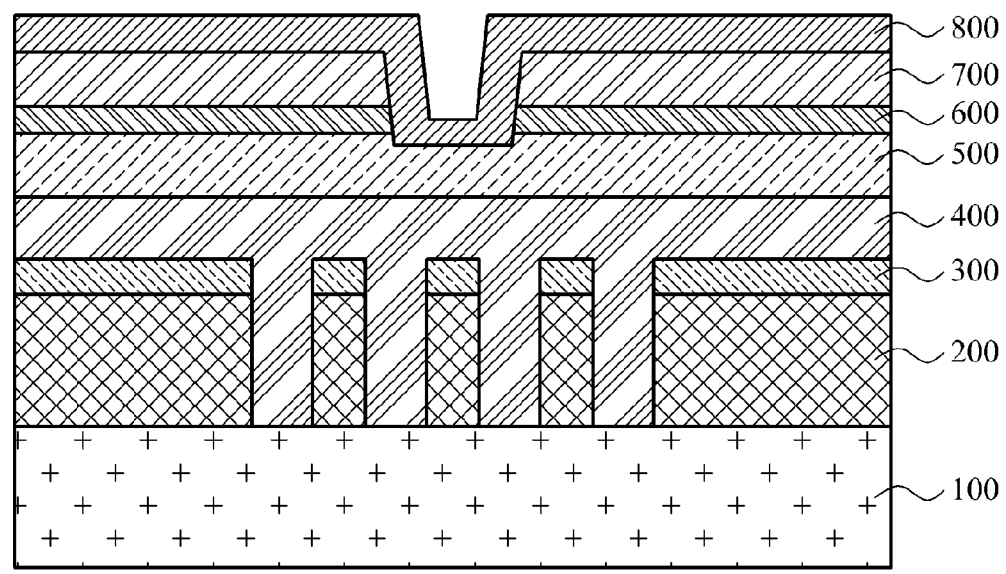

Subsequently, as shown in FIG. 4, to insulate devices, a gate insulating layer 800 may be formed after etching the source electrode contact layer 700, the p-GaN layer 600, and an upper portion of the n-GaN layer 500 having a higher doping concentration of the n-type dopant than the second drift region 400. The gate insulating layer 800 may include a material selected from $SiO_x$, $SiN_x$, $Al_2O_3$, hafnium oxide ($HfO_2$), and gallium oxide ($Ga_2O_3$).

Figure 5:
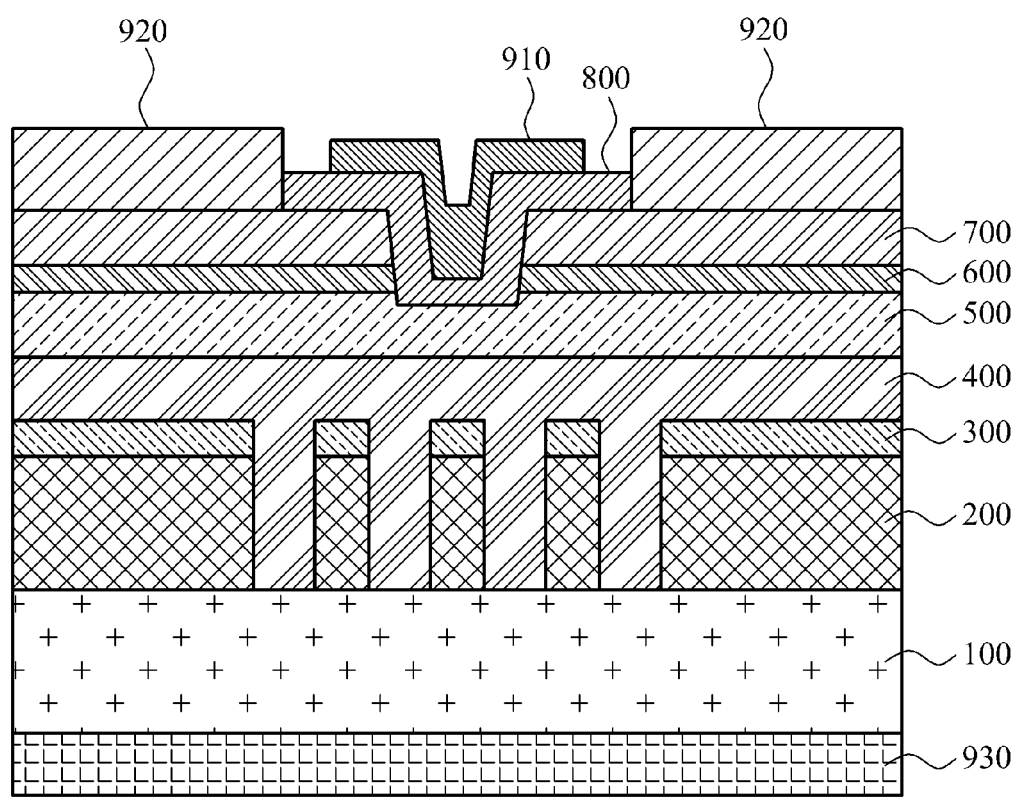

As shown in FIG. 5, after the gate insulating layer 800 is formed, the source electrodes 920 may be formed on the source electrode contact layer 700, and the gate electrode 910 may be formed on the insulating layer 800. In addition to the gate insulating layer 800, another insulating layer (not illustrated) may be formed between the source electrodes 920 and the gate electrode 910 and thus, a short occurring between the source electrodes 920 and the gate electrode 910 may be prevented.

The source electrodes 920 may be formed on positions corresponding to the source electrode contact layer 700, and may include a material selected from chromium (Cr), aluminum (Al), tantalum (Ta), molybdenum (Mo), tungsten (W), titanium (Ti), and gold (Au). The gate electrode 910 may be formed on a position corresponding to the gate insulating layer 800, and may be formed between the source electrodes 920. The gate electrode 910 may include a material selected from nickel (Ni), Al, Ti, titanium nitride (TiN), platinum (Pt), Au, ruthenium oxide ($RuO_2$), vanadium (V), W, tungsten nitride (WN), hafnium (Hf), hafnium nitride (FIN), Mo, nickel silicide (NiSi), cobalt silicide ($CoSi_2$), tungsten silicide ($WSi_2$), platinum silicide (PtSi), iridium (Ir), zirconium (Zr), Ta, tantalum nitride (TaN), copper (Cu), ruthenium (Ru), cobalt (Co), and combinations thereof.

The drain electrode 930 may be formed on one side of the substrate 100, that is, on an opposite side of the first drift region 200. The drain electrode 930 may include a material selected from Cr, Al, Ta, Mo, W, Ti, and Au. The drain electrode 930 may be formed to face the source electrodes 920 and thus, a vertically structured power device may be formed.

A process of forming the drain electrode 930 may be different for a type of the substrate 100. Hereinafter, various processes of forming the drain electrode 930 based on the type of the substrate 100 will be described.

When the substrate 100 is a conductive substrate, the drain electrode 930 may be directly formed on the substrate 100 without removing the substrate 100. When the substrate 100 is a sapphire substrate, an $n^+$-GaN layer may be formed on the substrate 100, the sapphire substrate may be removed through a laser lift off process, and the drain electrode 930 may be formed. When the substrate 100 is a Si substrate, an $n^+$-GaN layer may be formed on the substrate 100, the Si substrate may be removed through a wet etching process with a potassium hydroxide (KOH) solution, and the drain electrode 930 may be formed.

A power device manufactured based on an embodiment of the present invention may grow n-GaN to form a second drift region and thus, a crystal may not be damaged and a reliability may be secured. Also, an ion-implantation device and the like may not be additionally used and thus, a process may be simplified and a cost may be reduced. A first drift region and the second drift region are alternately disposed to form a super-junction structure and thus, a withstand voltage may increase since a depletion layer is formed near a p-n junction surface during a p-n junction. Also, an ON-resistance may be reduced in a source electrode contact layer. An n-GaN layer having a higher doping concentration of an n-type dopant than the second drift region may be formed on the second drift region and thus, the power device may be capable of performing a normally-OFF operation and thus, a power consumption may be reduced.

According to embodiments of the present invention, a power device manufacturing method may form a second drift region by growing n-GaN and thus, a crystal may not be damaged and a reliability may be secured. Also, an ion-implantation device and the like may not be additionally used and thus, a process may be simplified and a cost may be reduced.

In addition, a first drift region and the second drift region are alternately disposed so as to form a super-junction structure of n-GaN and p-GaN and thus, a withstand voltage may increase since a depletion layer is formed between n-GaN and p-GaN when a reverse voltage is applied.

Further, a current density may increase by reducing an ON-resistance in a source electrode contact layer. An n-GaN layer having a higher doping concentration of an n-type dopant than the second drift region may be formed on the second drift region, and the power device may be capable of performing a normally-OFF operation and thus, power consumption may be reduced.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A method of manufacturing a power device, the method comprising:
    forming a first drift region on a substrate;
    forming a passivation layer on the first drift region;
    forming a trench by patterning the first drift region with the passivation layer;
    forming a second drift region by growing n-gallium nitride (GaN) in the trench, and alternately disposing the first drift region and the second drift region;
    forming a source electrode contact layer on the second drift region;
    forming a drain electrode on one side of the substrate which is an opposite side of the first drift region;
    forming an n-GaN layer directly on the second drift region;
    etching the source electrode contact layer and the n-GaN layer;
    forming a gate insulating film in the etched portion of the source electrode contact layer and the n-GaN layer;
    forming a source electrode on the source electrode contact layer; and
    forming a gate electrode on the gate insulating film,
    wherein a doping concentration of an n-type dopant doped on the n-GaN layer is higher than that of the second drift region, and
    wherein the second drift region has a portion disposed on the passivation layer formed on the first drift region.

2. The method of claim 1, wherein the forming of the second drift region is performed in a temperature range from 1000° C. to 1200° C.

3. The method of claim 1, wherein the doping concentration of the n-type dopant doped on the n-GaN layer is in a range from $1.0 \times 10^{17}/cm^3$ to $1.0 \times 10^{20}/cm^3$.

4. The method of claim 1, wherein the first drift region comprises at least one of p-GaN and aluminum gallium nitride (AlGaN).

5. The method of claim 1, wherein the source electrode contact layer comprises at least one of an $n^+$-GaN layer and a heterojunction of AlGaN and GaN.

6. The method of claim 1, wherein the substrate is selected from a group consisting of $n^+$-GaN, $n^+$-silicon carbide (SiC), sapphire, and silicon (Si).

7. The method of claim 1, wherein the source electrode comprises a material selected from a group consisting of chromium (Cr), aluminum (Al), tantalum (Ta), molybdenum (Mo), tungsten (W), titanium (Ti), and gold (Au).

8. The method of claim 1, wherein the passivation layer is selected from a group consisting of silicon oxide ($SiO_x$), silicon nitride ($SiN_x$), aluminum oxide ($Al_2O_3$), and silicon carbide (SiC).

9. The method of claim 1, further comprising:
    forming a p-GaN layer directly on the n-GaN layer; and
    etching the p-GaN layer, wherein the gate insulating film is formed in the etched portion of the source electrode contact layer, the p-GaN layer, and the n-GaN layer.

10. The method of claim 9, wherein the etched portion includes substantially a U-shape.

11. The method of claim 10, wherein the gate insulating film and the gate electrode include substantially a U-shape.

\* \* \* \* \*